US010260358B2

(12) United States Patent
Kittleson et al.

(10) Patent No.: US 10,260,358 B2
(45) Date of Patent: Apr. 16, 2019

(54) CERAMIC MATRIX COMPOSITE COMPONENT AND PROCESS OF PRODUCING A CERAMIC MATRIX COMPOSITE COMPONENT

(71) Applicant: GENERAL ELECTRIC COMPANY, Schenectady, NY (US)

(72) Inventors: Jacob John Kittleson, Greenville, SC (US); Victor John Morgan, Simpsonville, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 579 days.

(21) Appl. No.: 14/926,718

(22) Filed: Oct. 29, 2015

(65) Prior Publication Data
US 2017/0122113 A1    May 4, 2017

(51) Int. Cl.
*F01D 5/28* (2006.01)
*F23R 3/00* (2006.01)
(Continued)

(52) U.S. Cl.
CPC .............. *F01D 5/282* (2013.01); *B32B 18/00* (2013.01); *C04B 35/117* (2013.01); *C04B 35/185* (2013.01); *C04B 35/563* (2013.01); *C04B 35/565* (2013.01); *C04B 35/573* (2013.01); *C04B 35/583* (2013.01);
(Continued)

(58) Field of Classification Search
CPC ................................ F23R 3/002; F23R 3/007; F23R 2900/00018; F01D 5/282; F01D 5/284; C04B 35/80; C04B 35/803; F05D 2300/6033; F05D 2230/31
See application file for complete search history.

(56) References Cited

U.S. PATENT DOCUMENTS

| | | | | | |
|---|---|---|---|---|---|
| 3,698,834 | A | * | 10/1972 | Meginnis | ................. F01D 5/184 416/231 R |
| 5,842,829 | A | * | 12/1998 | Cunha | ...................... F01D 5/186 415/115 |

(Continued)

FOREIGN PATENT DOCUMENTS

| | | |
|---|---|---|
| EP | 2 918 569 A1 | 9/2015 |
| FR | 2 864 829 A1 | 7/2005 |
| WO | 2015/041823 A1 | 3/2015 |

OTHER PUBLICATIONS

Extended European Search Report and Opinion issued in connection with corresponding EP Application No. 16195354.2 dated Mar. 29, 2017.

*Primary Examiner* — Andrew H Nguyen
(74) *Attorney, Agent, or Firm* — McNees Wallace & Nurick LLC

(57) ABSTRACT

A process of producing a ceramic matrix composite component. The process includes positioning a plurality of ceramic matrix composite plies on top of one another and forming a cavity therein. At least a portion of the cavity includes a terminal diameter sufficiently small to permit infiltration of a densifying material. The plurality of ceramic matrix composite plies are densified to form a densified body. The densifying results in the portion of the cavity including the terminal diameter being filled with densifying material and the cavity is present in the densified body. A ceramic matrix composite having cavities therein is also disclosed.

20 Claims, 5 Drawing Sheets

(51) Int. Cl.

| | | |
|---|---|---|
| *C04B 35/80* | (2006.01) | |
| *C23C 16/44* | (2006.01) | |
| *F01D 9/02* | (2006.01) | |
| *F01D 11/08* | (2006.01) | |
| *F01D 25/00* | (2006.01) | |
| *F23R 3/42* | (2006.01) | |
| *B32B 18/00* | (2006.01) | |
| *C04B 35/117* | (2006.01) | |
| *C04B 35/185* | (2006.01) | |
| *C04B 35/563* | (2006.01) | |
| *C04B 35/565* | (2006.01) | |
| *C04B 35/573* | (2006.01) | |
| *C04B 35/583* | (2006.01) | |
| *C04B 35/597* | (2006.01) | |
| *C04B 35/638* | (2006.01) | |
| *F01D 5/18* | (2006.01) | |
| *F01D 9/06* | (2006.01) | |
| *F01D 11/24* | (2006.01) | |

(52) U.S. Cl.
CPC ......... *C04B 35/597* (2013.01); *C04B 35/638* (2013.01); *C04B 35/80* (2013.01); *C04B 35/803* (2013.01); *C23C 16/44* (2013.01); *F01D 5/186* (2013.01); *F01D 5/284* (2013.01); *F01D 9/02* (2013.01); *F01D 9/065* (2013.01); *F01D 11/08* (2013.01); *F01D 11/24* (2013.01); *F01D 25/005* (2013.01); *F23R 3/002* (2013.01); *F23R 3/007* (2013.01); *F23R 3/42* (2013.01); *C04B 2235/428* (2013.01); *C04B 2235/522* (2013.01); *C04B 2235/524* (2013.01); *C04B 2235/5224* (2013.01); *C04B 2235/5228* (2013.01); *C04B 2235/5236* (2013.01); *C04B 2235/5244* (2013.01); *C04B 2235/5248* (2013.01); *C04B 2235/5268* (2013.01); *C04B 2235/614* (2013.01); *C04B 2235/616* (2013.01); *C04B 2235/945* (2013.01); *C04B 2237/365* (2013.01); *C04B 2237/38* (2013.01); *C04B 2237/62* (2013.01); *F05D 2220/32* (2013.01); *F05D 2230/12* (2013.01); *F05D 2230/13* (2013.01); *F05D 2230/314* (2013.01); *F05D 2230/60* (2013.01); *F05D 2240/11* (2013.01); *F05D 2240/35* (2013.01); *F05D 2240/80* (2013.01); *F05D 2240/81* (2013.01); *F05D 2260/202* (2013.01); *F05D 2260/204* (2013.01); *F05D 2300/222* (2013.01); *F05D 2300/2261* (2013.01); *F05D 2300/6033* (2013.01); *F23R 2900/00018* (2013.01); *Y02T 50/672* (2013.01); *Y02T 50/676* (2013.01)

(56) References Cited

U.S. PATENT DOCUMENTS

| | | |
|---|---|---|
| 6,746,755 B2 | 6/2004 | Morrison et al. |
| 7,153,096 B2 | 12/2006 | Thompson et al. |
| 7,255,535 B2 | 8/2007 | Albrecht et al. |
| 8,202,588 B2 | 6/2012 | Keller et al. |
| 8,257,809 B2 | 9/2012 | Morrison et al. |
| 8,967,961 B2 * | 3/2015 | McCaffrey ............. F01D 5/147 415/200 |
| 2005/0118392 A1 * | 6/2005 | Millard .................. C04B 35/14 428/131 |
| 2007/0140835 A1 * | 6/2007 | Albrecht ................ F01D 5/147 415/115 |
| 2008/0124512 A1 * | 5/2008 | Steibel .................. C04B 35/573 428/105 |
| 2013/0251939 A1 * | 9/2013 | Kleinow ................ B32B 18/00 428/121 |

* cited by examiner

CERAMIC MATRIX COMPOSITE COMPONENT AND PROCESS OF PRODUCING A CERAMIC MATRIX COMPOSITE COMPONENT

FIELD OF THE INVENTION

The present invention relates generally to gas turbines for power generation and more specifically to methods of forming ceramic matrix composite components for hot gas path turbine components for gas turbines.

BACKGROUND OF THE INVENTION

As with turbine blades and vanes formed from more conventional superalloy materials, CMC blades and vanes are primarily equipped with cavities and cooling voids to reduce weight, reduce centrifugal load, and reduce operating temperatures of the components. These features are typically formed in CMC components using a combination of removable and expendable tooling. Internal cooling channels are advantageous for cooling the both metal and CMC hot-gas path hardware as they reduce cooling flow requirements and thermal gradients/stress.

Silicon carbide (SiC)-based ceramic matrix composite (CMC) materials have been proposed as materials for certain components of gas turbine engines, such as the turbine blades, vanes, nozzles, and buckets. Various methods are known for fabricating SiC-based components, including Silicomp, melt infiltration (MI), chemical vapor infiltration (CVI), polymer inflation pyrolysis (PIP), and oxide/oxide processes. Though these fabrication techniques significantly differ from each other, each involves the use of hand lay-up and tooling or dies to produce a near-net-shape part through a process that includes the application of heat at various processing stages.

Current fabrication methods for forming internal passages or cavities in CMC components use materials that need to be "melted" out or removed from the internal passage during the burn-out cycle. Forming CMC components with a cavity includes a number of steps, including using pre-forms. First, a plurality of ceramic plies, some of which can include reinforcing material or are pre-impregnated with matrix, are laid up on a mandrel or mold in a pre-determined pattern to provide desired final or near-net-shape and desired mechanical properties of components. The mandrel is generally selected from materials such as tin, vinyl, or other meltable materials. The laid-up plies may be pre-impregnated (pre-preg) with matrix material, such as SiC or impregnated with matrix after lay-up of the plies. Prior to densification of the CMC pre-form, the mandrel is removed through a burn-out cycle. In the burn-out cycle, the CMC pre-form is inverted and the mandrel forming materials, such as tin, vinyl, or other meltable materials, are melted out through the open tip of the pre-form CMC leaving an open tip area.

BRIEF DESCRIPTION OF THE INVENTION

In an embodiment, a process of producing a ceramic matrix composite component. The process includes positioning a plurality of ceramic matrix composite plies on top of one another and forming a cavity therein. At least a portion of the cavity includes a terminal diameter sufficiently small to permit infiltration of a densifying material. The plurality of ceramic matrix composite plies are densified to form a densified body. The densifying results in the portion of the cavity including the terminal diameter being filled with densifying material and the cavity is present in the densified body.

In another embodiment, a ceramic matrix composite component. The ceramic matrix composite includes a plurality of ceramic matrix composite plies forming a densified body. The plurality of ceramic matrix plies form a cavity within the densified body. A portion of the cavity includes a terminal diameter having an infiltrated densifying material.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Embodiments of the present disclosure, for example, in comparison to concepts failing to include one or more of the features disclosed herein, enable near-wall cooling which reduces the thru-wall thermal gradient as well as more efficiently cooling the hot-gas-path hardware, and more efficient cooling that has the ability to reduce the cooling demand and flow-rate of the part. Embodiments of the present disclosure also permit lower cooling flow, for high turbine performance. In addition, the components of the present disclosure have a lower thermal gradient, resulting in lower stress, longer life and lower life cycle costs, as well as a greater flexibility in design. The method, according to the present disclosure, has decreased complexity with low cost and does not require expensive and time consuming leaching of cooling channels. Further, the method, according to the present disclosure, does not have the risk of residual sacrificial material remaining in cooling channels after processing.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Systems used to generate power include, but are not limited to, gas turbines, steam turbines, and other turbine assemblies, such as land based aero-derivatives, used for power generation. In certain applications, the power generation systems, including the turbomachinery therein (e.g., turbines, compressors, and pumps) and other machinery, may include components that are exposed to heavy wear conditions. For example, certain power generation system components, such as blades, buckets, casings, rotor wheels, shafts, shrouds, nozzles, and so forth, may operate in high heat and high revolution environments. These components are manufactured using ceramic matrix composites and these components may also include cooling passages. The present disclosure provides a method to form ceramic matrix composite (CMC) components including cooling passages. An exemplary embodiment of the disclosure is shown in FIGS. 1-3 as a turbine blade, but the present disclosure is not limited to the illustrated structure.

Figure 1:
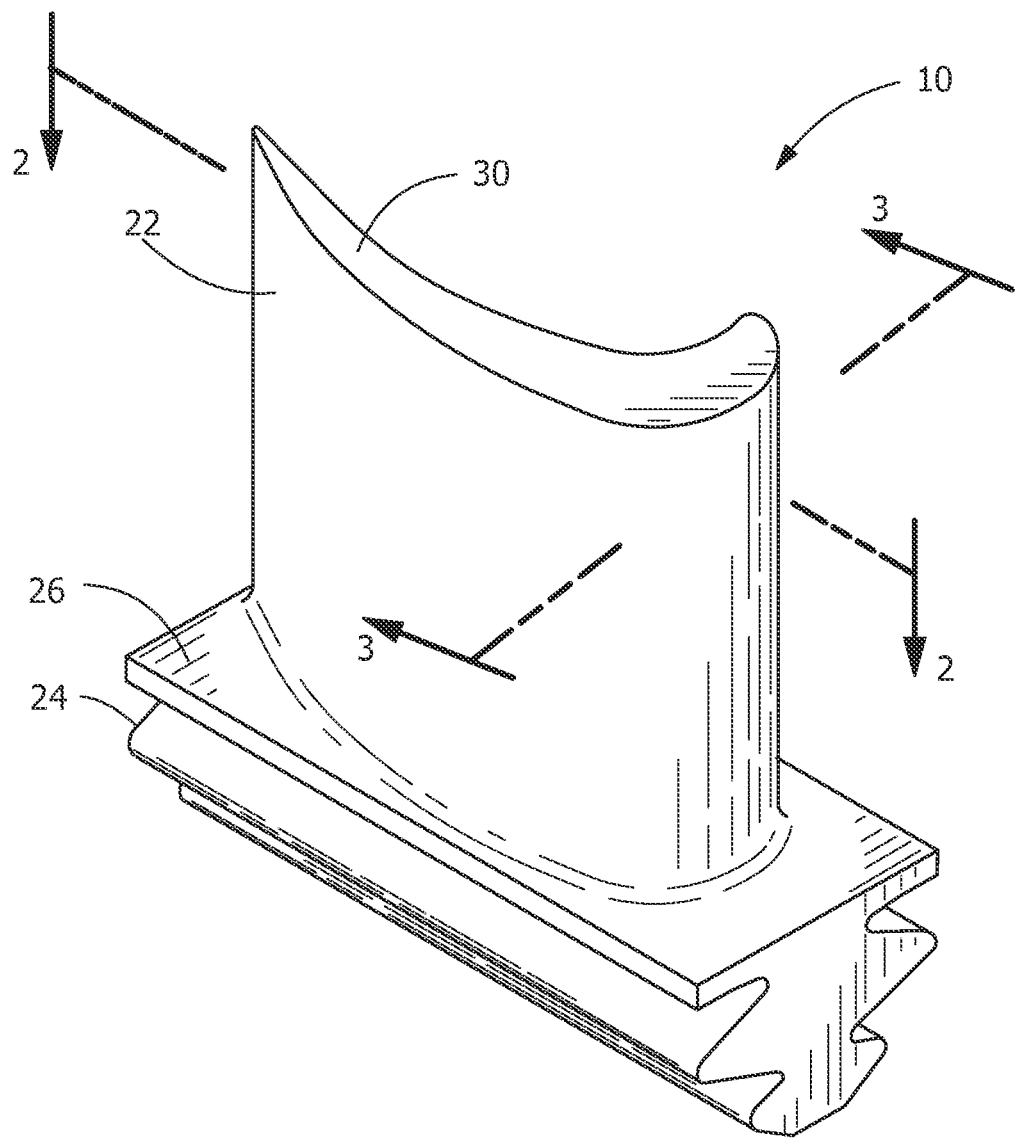
FIG. 1 is a perspective view of a ceramic matrix composite (CMC) component of the present disclosure.

FIG. 1 is a perspective view of a component 10, such as, but not limited to, a turbine blade or turbine vane. Although FIG. 1 shows a turbine blade, other suitable components, according to the present disclosure, include, but are not limited to, a liner, a blade, a shroud, a nozzle, a combustor, a nozzle end wall, a blade platform or other hot gas path component. Component 10 is preferably formed of a ceramic matrix composite (CMC) material. Material for component 10 includes, but is not limited to, an oxide based CMC, such as, but not limited to, alumina, mullite, boron nitride, boron carbide, sialons (silicon, aluminum, oxygen, and nitrogen), intermetallics, and combinations thereof. A suitable example of material for component 10 includes, but is not limited to, AN-720 (oxide-oxide based), which is available from COI Ceramics, Inc., San Diego, Calif., or a hybrid oxide CMC material. Suitable examples of materials used to make components 10, include, but are not limited to, SiC fibers impregnated with a SiC and carbon matrix with various binders. Component 10 includes an airfoil 22 against which the flow of hot exhaust gas is directed. The airfoil 22 extends from tip 30 to dovetail 24. Component 10 is mounted to a turbine disk (not shown) by the dovetail 24 which extends downwardly from airfoil 22 and engages a slot on the turbine disk. A platform 26 extends laterally outwardly from the area where airfoil 22 is joined to dovetail 24. Component 10 includes at least one plenum 50, as shown in FIG. 2, extending along the interior of airfoil 22. During operation of a power generation system, a flow of cooling air is directed through plenum 50 to reduce the temperature of airfoil 22.

Figure 2:
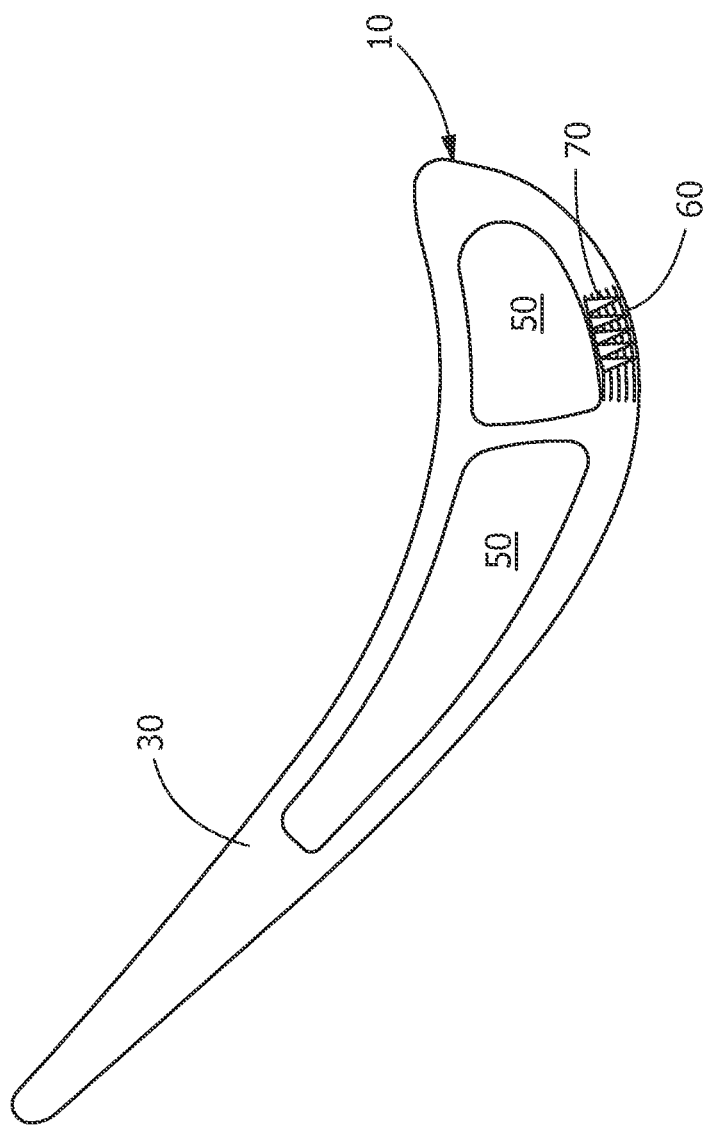
FIG. 2 is a sectional view taken in direction 2-2 of FIG. 1, according to the present disclosure.

FIG. 2 is a sectional view of component 10 taken in direction 2-2 of FIG. 1 showing internal cavities 70 of formed component 10. A plurality of ceramic matrix composite plies 60 (only a few have been shown for clarity) surround and form internal cavities 70. As shown in FIG. 2, ceramic matrix composite plies 60 include cavities 70 formed into and extending between ceramic matrix composite plies 60. Also visible in FIG. 2, the cavities formed in the component include a tapered geometry. The tapered geometry includes a larger diameter at one end of the ceramic matrix composite ply and a smaller diameter at the opposite end of the ceramic matrix composite ply 60.

Figure 3:
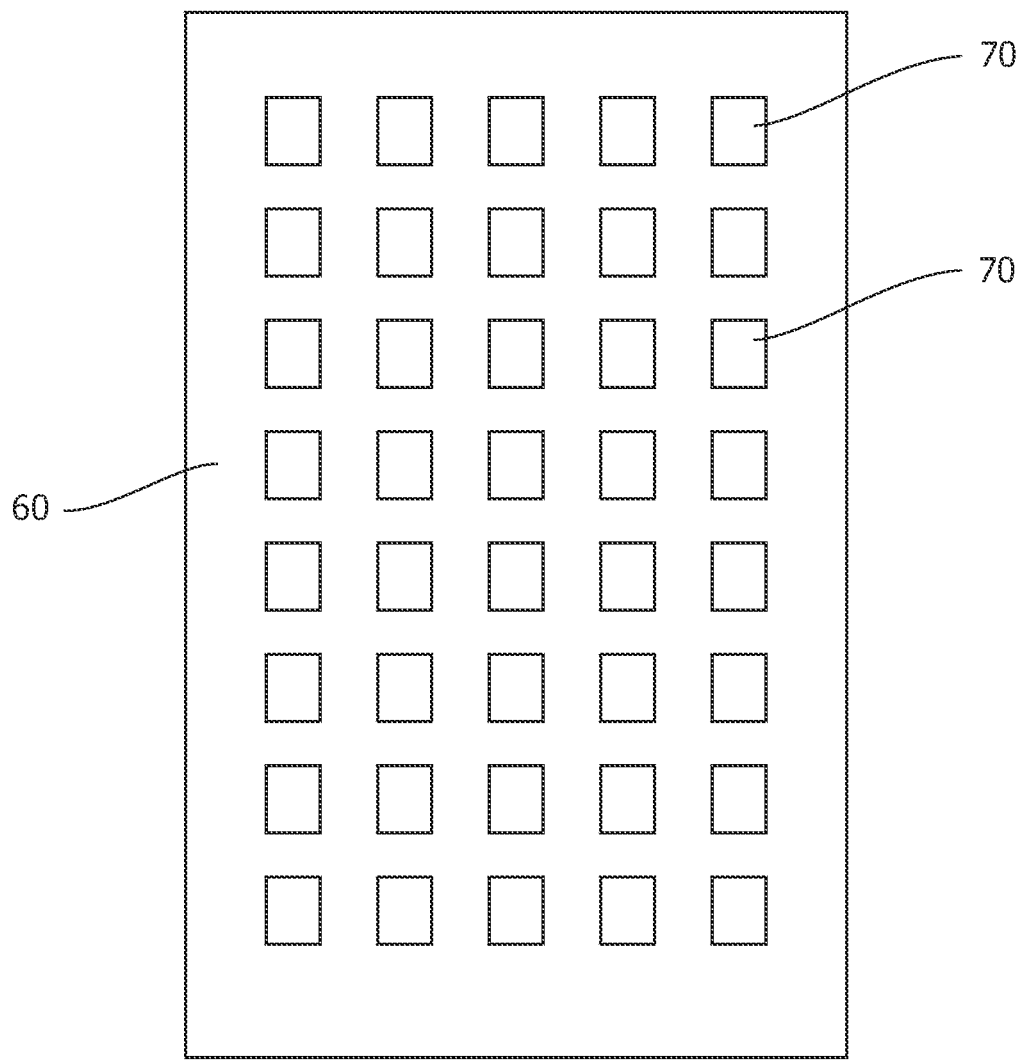
FIG. 3 is a sectional view taken in direction 3-3 of FIG. 1, according to the present disclosure.

FIG. 3 is a sectional view of component 10 taken in direction 3-3 of FIG. 1 showing ceramic matrix composite ply 60 having cavities 70 formed therein. Cavities 70 extend through ceramic matrix composite plies 60 and form openings sufficient to permit flow of fluid therethrough.

The arrangement of ceramic matrix composite plies 60 and the cavities 70 are schematic and have been enlarged for illustration purposes. The size and geometry of the ceramic matrix composite plies and voids are not limited to those shown in FIGS. 1-3. In addition, although the cavities 70 are shown to be internal to component 10, in another embodiment, cavities 70 are open to and fluidly communicate with plenum 50, other cavities 70, external to the component 10, or combinations thereof.

Figure 4:
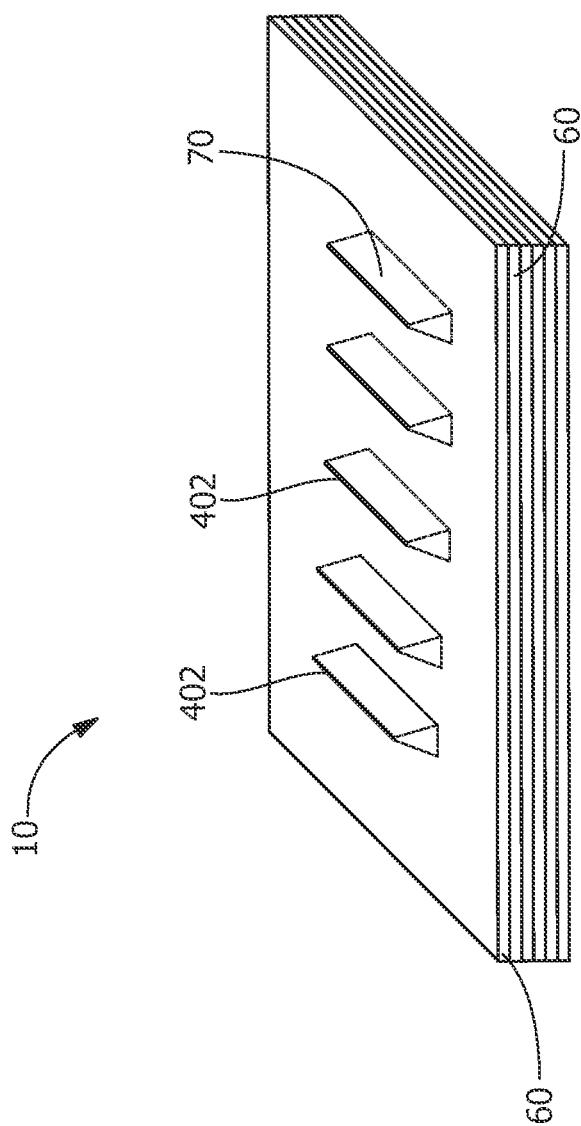
FIG. 4 shows a prospective view of a component, according to the present disclosure.

FIG. 4 shows a prospective view of a component 10, according to the present disclosure, wherein the cavities 70 are present within the component 10. As shown in FIG. 4, the component 10 includes densified matrix material 402 that forms a cap or blockage in the cavity 70. Cavity 70 includes a tapered geometry that includes a portion within the component 10 that is hollow and permits flow of fluid and a portion of densified matrix material 402 that prevents or substantially prevents flow of fluid.

Figure 5:
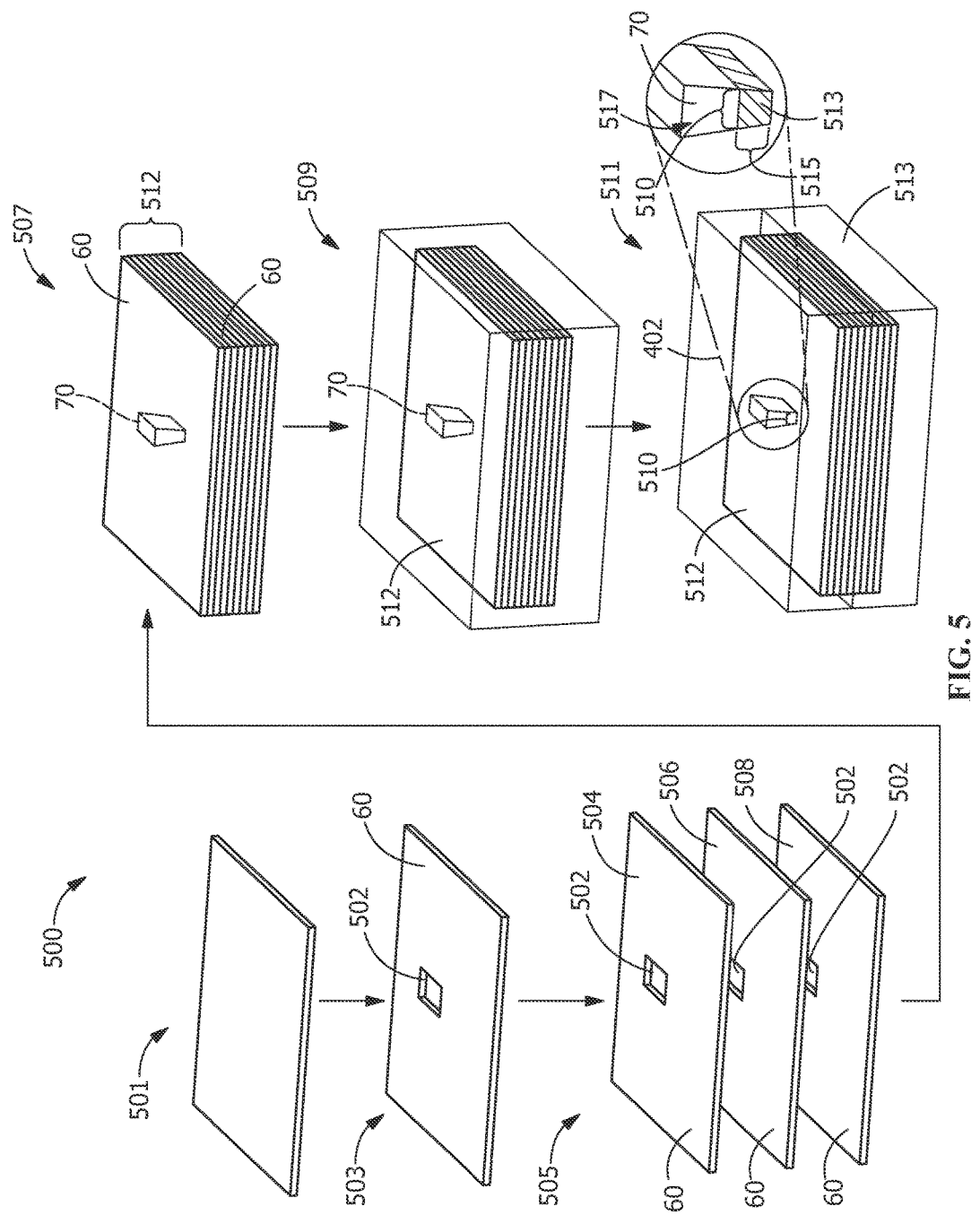
FIG. 5 schematically shows a prospective view of a process for forming a CMC component, according to the present disclosure.

FIG. 5 schematically shows a process of forming a CMC component 10, according to the present disclosure, having internal cavities 70 therein (see also, FIG. 4). As shown in FIG. 5, component 10 is formed using a lay-up technique. Process 500 includes providing a ceramic matrix composite ply 60 (step 501). The ceramic matrix composite ply 60 may be a single ply or a plurality of plies, such as a series of plies formed into a laminate stack. An example of material for plies 60 includes, but is not limited to, pre-preg composite plies including, for example, woven carbon fiber, binder material and coated SiC fibers. Other suitable materials for plies 60 include oxides containing alumina, zirconia, titania, magnesium, silica, mullite, and/or spinel; carbides containing silicon, boron, and/or titanium; nitrides containing silicon, and boron. Other known fibers suitable for use in the plies 60 include Nextel, Nicalon, hi-Nicalon, Tyranno, and Sylramic fibers. After providing ceramic matrix composite ply 60, a void 502 is formed in ceramic matrix composite ply 60 (step 503). The void 502 is formed using any suitable technique for forming openings in CMC materials. The geometry of the void includes any suitable geometry including a rounded, curved, elliptical, rectilinear or other suitable geometry for receiving a cooling flow. In one embodiment, the void 502 is a rectilinear slot. Suitable void forming techniques include, laser drilling, electrical discharge machining, cutting or machining the ceramic matrix composite material of the ceramic matrix composite ply 60. In one embodiment, the void 502 is formed in a continuous sheet, as shown in FIG. 5. In another embodiment, void 502 is formed by forming openings discontinuously in plies 60, wherein the plies 60, each having portions cut or otherwise removed along their edges, are fit together to form a void 502. The voids 502 in each of the ceramic matrix composite plies 60 is arranged such that a terminal diameter 510 is provided in one of the dimensions of the formed cavity. The terminal diameter 510 is a diameter in which matrix material is permitted to flow during densification and solidify to form a cap or blockage for cavity 70. Although the term "terminal diameter" is utilized, it is understood that the diameter of the cross-section is a hydraulic diameter, based upon the specific geometry of the cross-section, wherein hydraulic diameter is a function of the wetted perimeter and cross sectional area.

After the voids 502 are formed in ceramic matrix composite plies 60, ceramic matrix composite plies 504, 506, and 508 are positioned with respect to one another wherein the voids in the respective ceramic matrix composite plies 60 are aligned to define a cavity 70 having a geometry that results in a terminal diameter along at least a portion of the cavity (step 505). The stacking of the aligned voids 502 forms the cavity 70. The alignment is such that the voids 502 have a geometry that corresponds to the adjacent ceramic matrix composite ply and align to permit an alteration of the diameter of the void to vary to include a terminal diameter 510 at some point within the cavity 70. As shown in FIG. 5, the terminal diameter 510 is along cavity 70 at a point at a distance 515 from the bottom of the stack 512 with respect to the direction of gravity. The present disclosure is not limited to the number of ceramic matrix composite plies 60 shown in FIG. 5. The number of ceramic matrix composite plies 60 varies based upon the desired size and configuration of the component 10 and is not particularly limited. Although not shown in FIG. 5, in one embodiment, the cavity 70 is formed in a stack 512 of a plurality of ceramic matrix composite plies 60. Formation of the cavity 70 may be by forming techniques such as, but not limited to, laser drilling, electrical discharge machining, cutting or machining.

The terminal diameter 510 of the cavity is defined as the diameter in the cavity that has a dimension sufficiently small that the matrix material is moved according to capillary forces into the cavity 70 and solidifies to provide a cap or blockage. In one embodiment, the terminal diameter 510 is a hydraulic diameter of less than about 80 thousandths (0.080 inches). In one embodiment, the cavity ranges from about 5 thousandths (0.005 inches) to about 80 thousandths (0.080 inches), from about 20 thousandths (0.020 inches) to about 75 thousandths (0.075 inches) or from about 30 thousandths (0.030 inches) to about 70 thousandths (0.070 inches).

The cavity 70 is formed in a stack 512 with ceramic matrix composite plies surrounding the cavity (step 507). The stack 512 is placed in an autoclave and an autoclave cycle is completed (step 509). The stack 512 is subject to typical autoclave pressures and temperature cycles used in the industry for ceramic composite materials. Autoclaving pulls out any volatiles remaining in the plies and autoclave conditions can be varied depending on the ply material. After autoclaving, a burn-out process is performed to remove any remaining mandrel material or additional binders in the stack 512. The burn-out process is generally conducted at a temperature of approximately 426-648° C. (approximately 800-1200° F.).

After burn-out, the pre-form component is placed in a vacuum furnace for densification (step 511). Densification is performed using any known densification technique including, but not limited to, Silicomp, melt infiltration (MI), chemical vapor infiltration (CVI), polymer inflation pyrolysis (PIP), and oxide/oxide processes. Densification can be conducted in a vacuum furnace having an established atmosphere at temperatures above 1200° C. to allow silicon or other infiltrant materials to melt-infiltrate into the pre-form component. As shown in FIG. 5, one suitable method of densification is melt infiltration wherein molten matrix material 513 is drawn into stack 512 and permitted to solidify. The stack includes a terminal diameter 510 for cavity 70 such that the matrix material is permitted to infiltrate and solidify to form a cap or blockage of densified matrix material 402. However, the internal hollow portion 517 of the cavity 70 remains open and hollow after densification, sufficient to permit flow of cooling fluid. After densification, densified stack 512 or densified body includes internal cavities 70, as shown in FIG. 4, and forms at least a portion of component 10.

In one embodiment, internal hollow portion 517 of cavities 70 are sufficiently large and open in component 10 such that coolant or other fluid can be directed therethrough to provide cooling to component 10. However, the densified matrix material 402 formed at the ceramic matrix composite ply 60 having the terminal diameter 510 forms a blockage that substantially prevents flow of coolant or other fluids. The cavities 70, as manufactured according, for example, to the process shown in FIG. 5, are closed and internal to the component 10. In one embodiment, openings are machined or otherwise formed into the component to provide inlets and/or outlets to the cavities to permit flow therethrough. The cavities 70 for cooling may be fed and/or exhausted to and/or from the plenum 50, other cavities 70 or external to the component, by machining or otherwise forming openings, such as feed holes and hot-gas path dump holes, into the component 10.

In another embodiment, the cavities 70 may be formed such that the entire or a substantial portion of the cavity 70 includes a terminal diameter 510, wherein the flow of the molten matrix material 513 is facilitated or enhanced, providing a quicker and/or more uniform distribution of matrix material during densification.

In one embodiment, the fibers of plurality of a ceramic matrix composite ply at an end of the cavity form a greater than 10 degree angle to a center axis of the cavity.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process of producing a ceramic matrix composite component, the process comprising:
   positioning a plurality of ceramic matrix composite plies on top of one another and forming a cavity therein, the cavity including a tapered cross-sectional geometry; and
   densifying the plurality of ceramic matrix composite plies to form a densified body, the densifying resulting in a terminal portion of the cavity disposed at a tapered end of the tapered cross-sectional geometry being filled with densifying material, and an internal hollow portion of the cavity being sufficiently open to permit a flow of fluid along the cavity,
   wherein the internal hollow portion of the cavity is present in the densified body, and
   wherein forming the cavity includes a method selected from the group consisting of:
   (a) forming a void in each of the plurality of ceramic matrix composite plies and aligning the voids in the respective ceramic matrix composite plies to at least partially define the cavity in the component, the aligning including aligning the plurality of ceramic matrix composite plies; and
   (b) positioning the plurality of ceramic matrix composite plies on top of one another and then forming the cavity and the tapered cross-sectional geometry by a technique selected from the group consisting of laser drilling, electrical discharge machining, cutting and machining.

2. The process of claim 1, wherein the cavity is entirely enclosed within the densified body.

3. The process of claim 1, wherein the cavity is a cooling channel and the fluid is a cooling fluid.

4. The process of claim 1, wherein the ceramic matrix composite plies are pre-impregnated ceramic matrix composite plies.

5. The process of claim 1, wherein the forming of the cavity is by positioning the plurality of ceramic matrix composite plies on top of one another and then forming the cavity and the tapered cross-sectional geometry by the technique selected from the group consisting of laser drilling, electrical discharge machining, cutting and machining.

6. The process of claim 1, wherein positioning the plurality of ceramic matrix composite plies on top of one another and forming the cavity therein includes forming the void in each of the plurality of ceramic matrix composite plies and aligning the voids in the respective ceramic matrix composite plies to at least partially define the cavity in the component, the aligning including aligning the plurality of ceramic matrix composite plies.

7. The process of claim 1, wherein the densifying includes melt infiltration or chemical vapor deposition.

8. The process of claim 1, wherein the plurality of ceramic matrix composite plies include a plurality of fibers that form a greater than 10 degree angle with respect to a center axis of the cavity.

9. The process of claim 1, wherein the densifying material is silicon.

10. The process of claim 1, wherein the ceramic matrix composite component is a hot gas path turbine component selected from the group consisting of a liner, a blade, a shroud, a nozzle, a combustor, a nozzle end wall, and a blade platform.

11. A ceramic matrix composite component, comprising:
a plurality of ceramic matrix composite plies forming a densified body, the plurality of ceramic matrix plies forming a cavity within the densified body, wherein:
the cavity includes a tapered cross-sectional geometry;
a terminal portion of the cavity disposed at a tapered end of the tapered cross-sectional geometry is filled with an infiltrated densifying material;
an internal hollow portion of the cavity is sufficiently open to permit a flow of fluid along the cavity, and the cavity and the tapered cross-sectional geometry are at least partially defined by a void in each of the plurality of ceramic matrix composite plies.

12. The ceramic matrix composite component of claim 11, wherein the cavity is entirely enclosed within the densified body.

13. The ceramic matrix composite component of claim 11, wherein the cavity is a cooling channel and the fluid is a cooling fluid.

14. The ceramic matrix composite component of claim 11, wherein the cavity is selected from the group consisting of a laser drilled cavity, an electrical discharge machined cavity, a cut cavity, and a machined cavity.

15. The ceramic matrix composite component of claim 11, wherein the ceramic matrix composite component is a hot gas path turbine component selected from the group consisting of a liner, a blade, a shroud, a nozzle, a combustor, a nozzle end wall, and a blade platform.

16. The ceramic matrix composite component of claim 11, wherein the plurality of ceramic matrix composite plies include a plurality of fibers that form a greater than 10 degree angle with respect to a center axis of the cavity.

17. The ceramic matrix composite component of claim 11, wherein the tapered cross-sectional geometry is triangular.

18. The ceramic matrix composite component of claim 11, wherein the tapered cross-sectional geometry is trapezoidal.

19. The process of claim 1, wherein the tapered cross-sectional geometry is triangular.

20. The process of claim 1, wherein the tapered cross-sectional geometry is trapezoidal.

* * * * *